(12) United States Patent  (10) Patent No.: US 8,868,011 B2
Wright  (45) Date of Patent: Oct. 21, 2014

(54) POWER AMPLIFIER WITH FAST LOADLINE MODULATION

(75) Inventor: Peter V. Wright, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 35 days.

(21) Appl. No.: 13/460,513

(22) Filed: Apr. 30, 2012

(65) Prior Publication Data

US 2013/0285741 A1 Oct. 31, 2013

(51) Int. Cl.
*H03C 1/52* (2006.01)

(52) U.S. Cl.
USPC ............... 455/108; 455/114.1; 455/114.3; 455/552.1; 455/102; 330/10; 330/136

(58) Field of Classification Search
CPC .................... H04C 5/00; H04B 1/04
USPC ............ 455/108, 114.1, 114.3, 552.1, 102; 330/136, 10
See application file for complete search history.

(56) References Cited

U.S. PATENT DOCUMENTS

| | | | |
|---|---|---|---|
| 3,562,637 A | 2/1971 | Gikow | |
| 6,141,541 A | 10/2000 | Midya | |
| 6,349,216 B1 | 2/2002 | Alberth, Jr. | |
| 6,438,360 B1 | 8/2002 | Alberth, Jr. | |
| 6,553,216 B1 * | 4/2003 | Pugel et al. | 455/340 |
| 6,806,767 B2 * | 10/2004 | Dow | 330/51 |
| 7,102,429 B2 * | 9/2006 | Stengel et al. | 330/136 |
| 7,164,314 B2 * | 1/2007 | Ichitsubo et al. | 330/129 |
| 7,884,681 B1 * | 2/2011 | Khlat et al. | 332/149 |
| 7,982,543 B1 * | 7/2011 | Yuan | 330/295 |
| 8,026,773 B2 * | 9/2011 | Zhu et al. | 333/32 |
| 8,032,093 B1 * | 10/2011 | Epperson et al. | 455/114.1 |
| 8,086,263 B2 * | 12/2011 | Castaneda et al. | 455/550.1 |
| 8,207,798 B1 | 6/2012 | Wright | |
| 2004/0000948 A1 * | 1/2004 | Stengel et al. | 330/136 |

OTHER PUBLICATIONS

Hendy, Jeremy; "Envelope tracking for RF power amplifiers in mobile handsets;" Nijura Ltd.; http://www.techdesignforums.com/pcb/tag/envelope-tracking/; posted Mar. 7, 2012.

* cited by examiner

*Primary Examiner* — Sanh Phu
(74) *Attorney, Agent, or Firm* — Schwabe Williamson & Wyatt

(57) ABSTRACT

Embodiments of apparatuses, methods, and systems for a radio frequency amplification circuit providing for fast loadline modulation are generally described herein. Other embodiments may be described and claimed.

30 Claims, 8 Drawing Sheets

POWER AMPLIFIER WITH FAST LOADLINE MODULATION

FIELD

Embodiments of the present invention relate generally to the field of circuits, and more particularly to a power amplifier with fast loadline modulation.

BACKGROUND

Efforts are underway to increase the capacity of increasingly scarce frequency allocations to cellular carriers. These efforts have resulted in newer modulation schemes that have higher peak-to-average power ratios (PAPRs) as compared to previous schemes. One such modulation scheme, known as Long Term Evolution (LTE), can have PAPRs in the order of 10 decibels (dB).

Radio frequency (RF) power amplifiers may be inefficient when backed off from their maximum designed power output level unless driven by a switcher, e.g., a direct current (DC)-DC converter. Using a switcher may provide an efficient approach for legacy modulation schemes, e.g., carrier division multiple access (CDMA) and wireless-CDMA (W-CDMA), which have relatively low PAPRs, e.g., approximately 3 dB or less. In these cases, the switcher only has to follow a relatively slowly changing waveform envelope while maintaining sufficient headroom for linearity to provide desired efficiency over a wide range of output power levels.

In LTE, on the other hand, the waveform envelope changes much faster than with the legacy modulation schemes. Traditional switchers may not have the bandwidth to follow these changes in an effective manner.

BRIEF DESCRIPTION OF THE DRAWINGS

Embodiments of the invention are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Various blocks may be introduced and described in terms of an operation provided by the blocks. These blocks may include various hardware, software, and/or firmware elements in order to provide the described operations. While some of these blocks may be shown with a level of specificity, e.g., providing discrete elements in a set arrangement, other embodiments may employ various modifications of elements/arrangements in order to provide the associated operations within the constraints/objectives of a particular embodiment.

Figure 1:
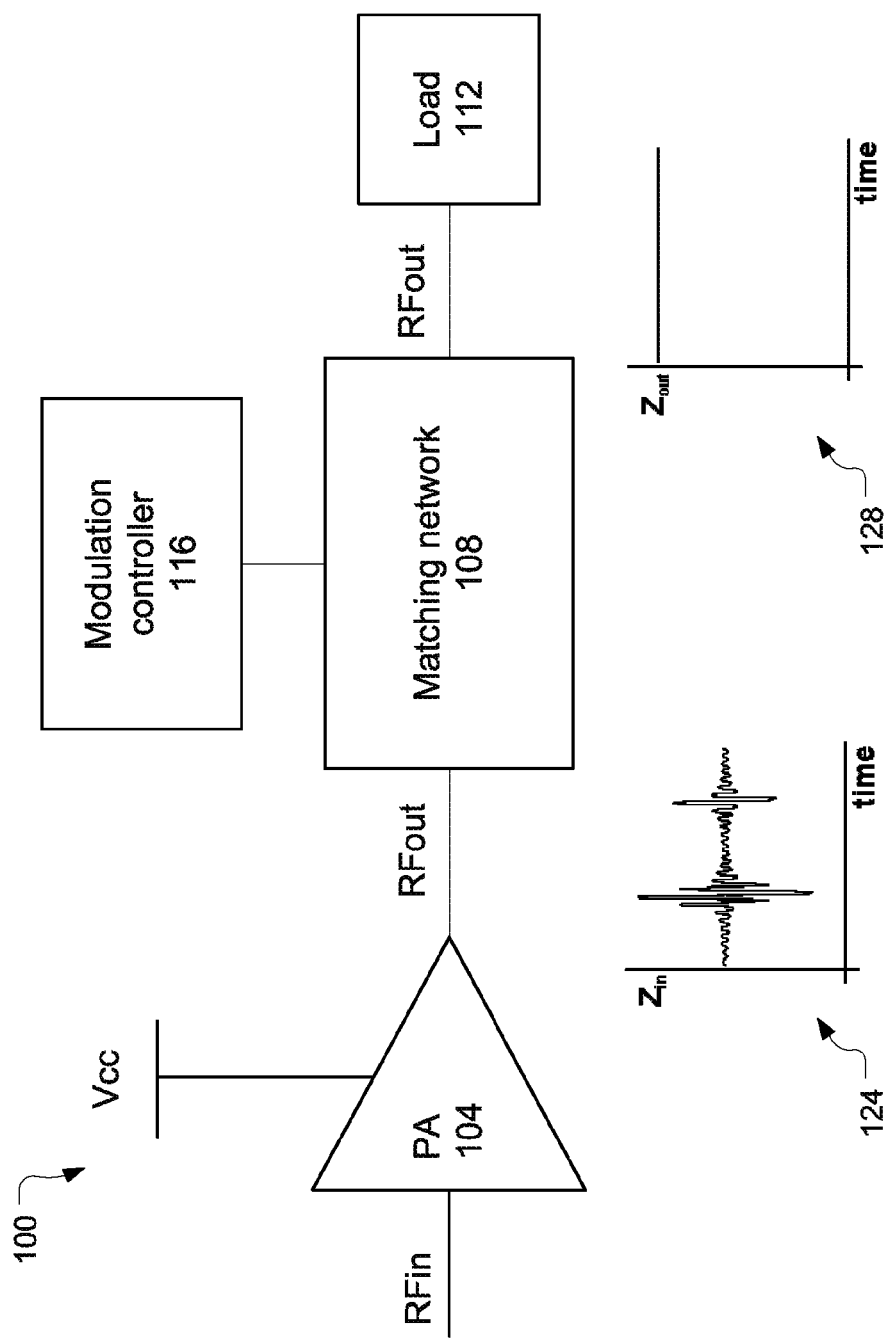
FIG. 1 illustrates a radio frequency amplification circuit in accordance with various embodiments of the present invention.

FIG. 1 illustrates a radio-frequency (RF) amplification circuit 100 in accordance with various embodiments. The RF amplification circuit 100 may have a power amplifier (PA) 104 to receive an input RF signal, RFin. The power amplifier 104 may output an amplified version of RFin as an output RF signal, RFout. The RF amplification circuit 100 may include a matching network 108 that transforms a relatively low impedance, e.g., 2-4 ohms, at an output of the power amplifier 104 to a relatively higher impedance, e.g., 50 ohms, at load 112.

The power delivered to the load 112 by the power amplifier 104 may depend on two primary variables. The first primary variable is a supply voltage, Vcc, provided to the power amplifier 104. The second primary variable is impedance as seen by the power amplifier 104. This may also be referred to as loadline. The loadline may be a function of the matching network 108.

The RF amplification circuit 100 may include a modulation controller 116 coupled with the matching network 108. The modulation controller 116 may control the matching network 108, e.g., by providing the matching network 108 with a control signal, in a manner to modulate the loadline presented to the power amplifier 104 to achieve high-efficiency amplification. Modulation of the loadline, as described herein, may improve the efficiency of the RF amplification circuit 100 when operating at backed-off power levels and/or with modulation schemes having high PAPRs.

FIG. 1 illustrates a waveform 124 of an input impedance, Zin, of the matching network 108 as seen by the power amplifier 104. FIG. 1 also illustrates a waveform 128 of an output impedance, Zout, of the matching network 108 provided to the load 112. The matching network 108 may provide for the fast modulation of the input impedance, which may also be referred to as loadline, to implement a fast amplitude modulation (AM) envelope of an RF signal waveform. The output impedance may be maintained at a relatively constant level, e.g., 50 ohms.

Fast loadline modulation may enhance efficiency of the RF amplification circuit 100 when operating under high PAPR signal waveforms typical of $4^{th}$ generation (4G) modulation standards such as LTE, OFDMA, etc. Fast loadline modulation may be defined herein as a modulation bandwidth that is comparable to or exceeds a bandwidth of amplitude modulation of the RF signal waveform. In various embodiments, the modulation bandwidth may be approximately 5 megahertz (MHz) or greater.

In various embodiments, the supply voltage may be fixed, while the loadline is modulated. In other embodiments, the supply voltage may be variable, but may vary at rates that differ from those at which the loadline is varied. The supply voltage may be varied by use of a switcher, e.g., a DC-DC converter, coupled with a supply terminal of the power amplifier 104.

Figure 2:
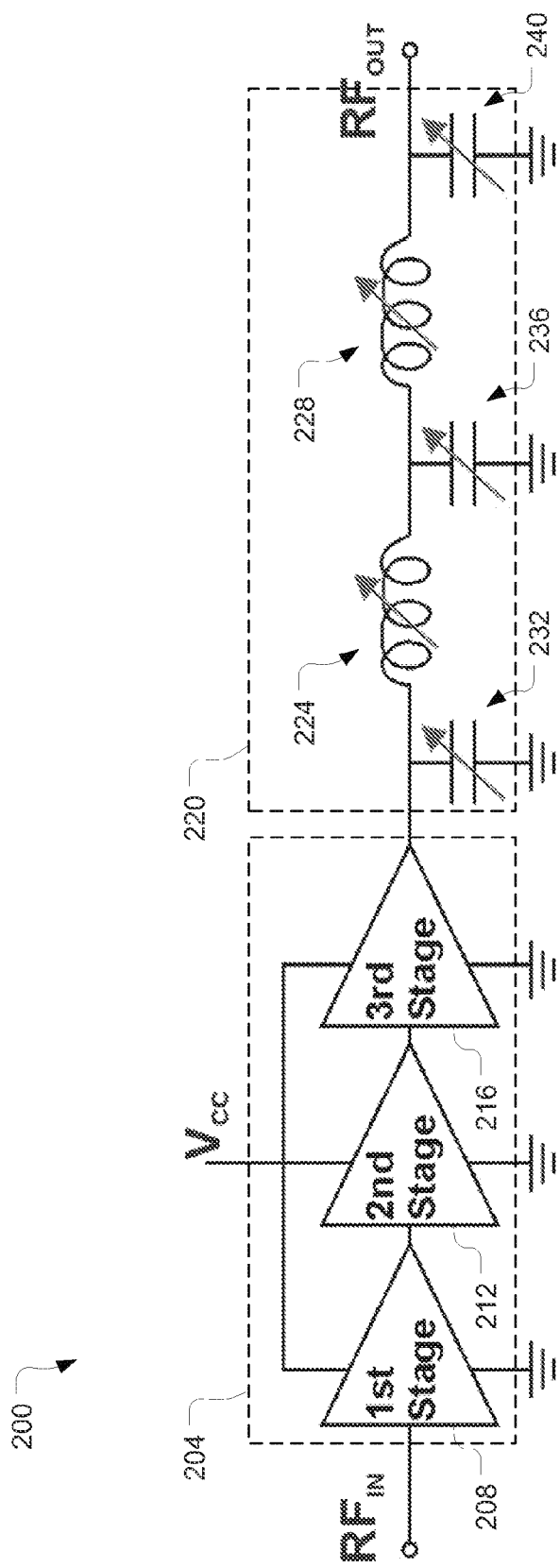
FIG. 2 illustrates a radio frequency amplification circuit in accordance with some embodiments.

FIG. 2 is an RF amplification circuit 200 that may be used to provide the fast loadline modulation described above in accordance with some embodiments. The RF amplification circuit 200 may be similar to, and substantially interchangeable with, RF amplification circuit 100. Unless stated otherwise, like-name components may be similar to, and substantially interchangeable with, one another.

The RF amplification circuit 200 may include a power amplifier 204 having three stages, $1^{st}$ stage 208, $2^{nd}$ stage 212, and $3^{rd}$ stage 216. The $3^{rd}$ stage may output an amplified RF signal to a matching circuit 220. In other embodiments, the power amplifier 204 may have other number of stages.

The matching circuit 220 may be a series LC matching network having series inductive elements 224 and 228 and shunt capacitive elements 232, 236, and 240. It may be understood that the matching circuit 220 may include other arrangements of elements.

A modulation controller, e.g., modulation controller 116, may be coupled with one or more of the series inductive elements 224 and 228, and/or shunt capacitive elements 232, 236, and 240 and may modulate the parameters of the elements to provide the fast loadline modulation. While all of the inductive and capacitive elements are shown as variable elements in FIG. 2, other embodiments may include various combinations of fixed and variable elements.

Figure 3A:
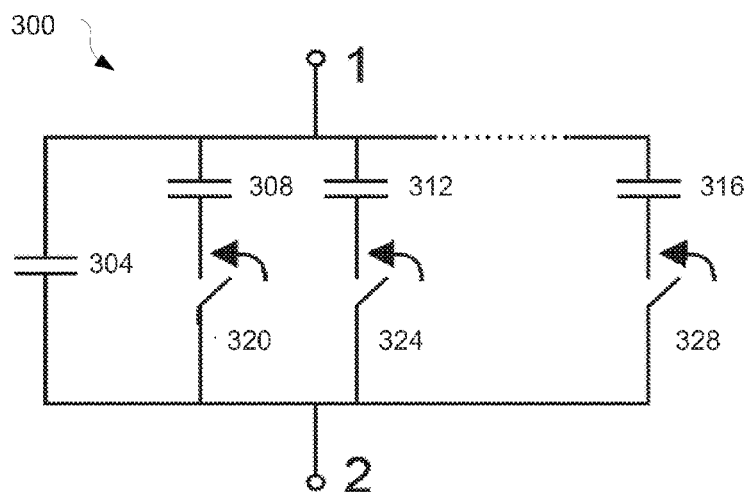
FIGS. 3(a)-(c) illustrate switched element banks in accordance with some embodiments.
Figure 3B:
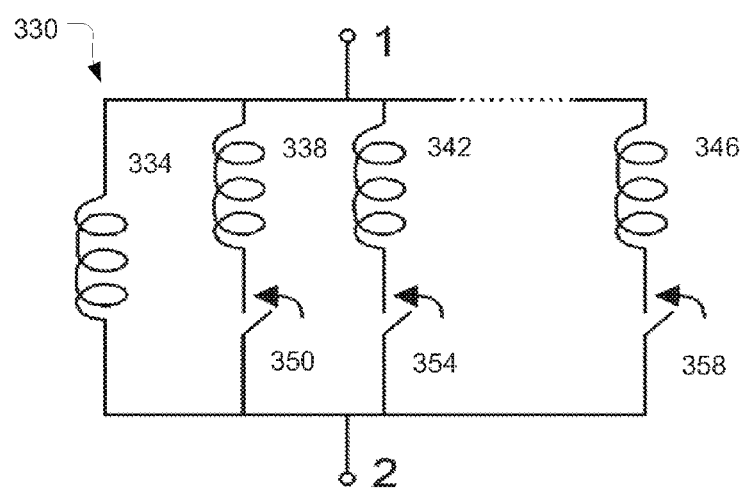
Figure 3C:
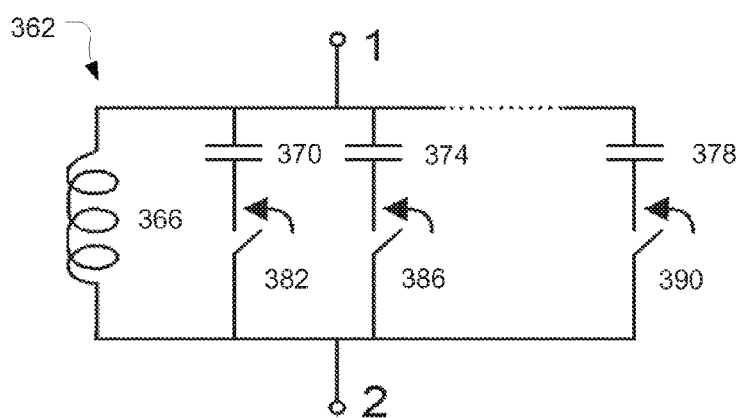

FIGS. 3(*a*)-(*c*) illustrate switched-element banks that may be used in a matching network, e.g., matching network 220, configured to provide fast load line modulation in accordance with some embodiments.

FIG. 3(*a*) illustrates a switched capacitor bank 300 that may be used as a variable capacitive element that may be dynamically controlled to provide a discrete capacitance in accordance with some embodiments. The switched capacitor bank 300 may be used for one or more of the shunt capacitive elements 232, 236, and/or 240.

The switched capacitor bank 300 may include a number of capacitors, e.g., 304, 308, 312, and 316, coupled in parallel with another. One or more of the capacitors may be coupled with a switch, e.g., 320, 324, and 328, so that the capacitor may be switched into or out of the switched capacitor bank 300 by operation of corresponding switch. While four capacitors and three switches are shown in FIG. 3, other embodiments may have other numbers of switches and/or capacitors.

FIG. 3(*b*) illustrates a switched inductor bank 330 that may be used as a variable inductive element that may be dynamically controlled to provide a discrete inductance in accordance with some embodiments. For example, the switched inductor bank 330 may be used for one or more of the series inductive elements 224 and/or 228.

The switched inductor bank 330 may include a number of inductors, e.g., 334, 338, 342, and 346, coupled in parallel with another. One or more of the inductors may be coupled with a switch, e.g., 350, 354, and 358, so that the inductor may be switched into or out of the switched inductor bank 330 by operation of corresponding switch. While four inductors and three switches are shown in FIG. 3(*b*), other embodiments may have other numbers of switches and/or inductors.

FIG. 3(*c*) illustrates a switched inductor bank 362 that may be used as an alternative to switched inductor bank 330 in accordance with some embodiments. For example, the switched inductor bank 362 may be used for one or more of the series inductive elements 224 and/or 228.

The switched inductor bank 362 may include an inductor 366 coupled in parallel with one or more capacitors, e.g., 370, 374, and 378. One or more of the capacitors may be coupled with a switch, e.g., 382, 386, and 390, so that the capacitor may be switched into or out of the switched inductor bank 362 by operation of corresponding switch. While one inductor, three capacitors, and three switches are shown in FIG. 3(*c*), other embodiments may have other numbers of switches, capacitors, and/or inductors.

A modulation controller, e.g., modulation controller 116, may control the switches of the switched capacitor bank 300, switched inductor bank 330 and/or switched inductor bank 362 in a manner to provide desired modulation of the load line.

To achieve the bandwidths desired for 4G waveforms, the switches of the switched banks of FIG. 3 may be semiconductor switches rather than microelectromechanical system (MEMS) switches, which may be too slow. The switches may be gallium arsenide (GaAs) switches, silicon on sapphire (SOS) switches, silicon on insulator (SOI) switches, silicon germanium (SiGe) switches, complementary metal oxide semiconductor (CMOS) switches, etc.

While the embodiments shown in FIG. 3 illustrate elements coupled in parallel with one another, other embodiments may use series-parallel arrangements of the elements to achieve desired variation in element values.

While these switch-based solutions for modulation of the loadline shown in FIG. 3 are feasible in some applications, they may also be associated with various challenges.

An envelope of an RF waveform is analog and fast varying. To impose the AM modulation on the RF waveform in a manner that maintains the fidelity of the desired output signal, the impedance modulation should also vary in a fast and continuous manner. However, with a switched-element bank approach, the envelope of the RF waveform is sampled periodically and the output level is restricted to a number of discrete values set by the number of bits (i.e. switches). If the analog waveform is not sampled on a small enough sampling period, or with an insufficient number of discrete states, noise or unwanted frequency components will be generated. This is known as quantization error.

This quantization error may be deleterious to the desired output waveform. For example, the quantization error may result in spectral regrowth or noise in frequency bands adjacent to the assigned frequency band that can affect receiver sensitivity and create unwanted spurious emissions that may be higher than allowed by regulatory requirements.

To reduce quantization error consistent with the system objectives for RF power amplification circuitry a minimum number of discrete levels (i.e. bits) must be used to ensure adequate fidelity of the amplified RF waveform. The quantization error can only be reduced by increasing the number of bits. In a switched-element implementation, this translates directly into the number of switches and elements that must be used for each component that must be modulated. This may result in driving up the size and cost of switched-element banks in order to meet system objectives.

Another consideration of the switched-element banks is the associated insertion loss. Semiconductor switches have a relatively high on-resistance, e.g., approximately 2 ohms. Since the output impedance of a power amplifier is typically in a range of 2-4 ohms, a significant increase in insertion loss, i.e., decreased efficiency, may occur if such switches are used to switch elements close to the power amplifier 104. Thus, in practice, it is likely that only elements close to the load 112, which are in a higher-impedance environment and at the opposite end of the matching network 108 from the power amplifier 104 can be switched with this approach. This may limit an impedance tuning range of a matching network.

As an alternative to relying on switches to modulate the loadline, some embodiments provide reactive elements that may have their associated reactive values fast modulated in a continuous or analog manner. For example, some embodiments may dynamically modulate individual capacitance values of variable capacitors in a matching network. The variable capacitors may include varactor diodes or capacitors constructed with a voltage-dependent dielectric, a borium strontium titanate (BST) dielectric. These variable capacitors may be referred to as varactor capacitors and BST capacitors, respectively. For both of these technologies, capacitance values may be modulated by means of an applied voltage in a continuous analog manner.

In some embodiments, one or more of the shunt capacitive elements 232, 236, and/or 240 of matching network 220 may be replaced with a variable capacitor. In some embodiments, one or more of the series inductive elements 224 and/or 228 may be replaced by a variable capacitor coupled in parallel with an inductor.

The use of analog loadline modulation technologies may be associated with a number of advantages. These include, but are not limited to: limit of distortion due to analog control; high quality factors associated with varactor and BST capacitors resulting in a low on-resistance (e.g., approximately 200 milliohms of BST capacitors), which may allow their use as modifiable impedance elements anywhere in the matching network 108 including at the output of the power amplifier 104; high reliability of passive elements, e.g., varactor and BST capacitors; minimal packaging requirement required for passive die; low-cost of the modulation controller 116, which may be realizable in complementary metal-oxide semiconductor (CMOS), due to bandwidth of control signals only being a few tens of MHz; and absence of switching spurs.

It may be noted that loadline modulation architectures described herein need not be forcibly modulated by an analog control signal. Some embodiments may use digital control signals assuming the bandwidth of such digital control signals meet or exceed the desired bandwidth of the modulation waveform. A further advantage of having the analog-capable loadline modulation architecture is that the user can decide what level of quantization of the control signal is desired for a given application. This is in contrast to the switched-element bank embodiments in which the quantization is fixed by the hardware.

While both types of variable capacitors discussed above may be capable of being modulated fast enough for fast loadline modulation, there are certain factors that should be considered in their implementation. These factors stem from the fact that both types of variable capacitors are two-terminal devices. Therefore, an RF signal across the device may lead to self-modulation of the capacitance, which may lead to distortion of the RF waveform. To overcome this, a number of variable capacitors may be stacked to reduce the RF voltage swing across any individual capacitor. However, in order to keep the modulation voltage low, e.g., less than 30 volts, a resistive feed network may be employed so that the modulation voltage is effectively applied in parallel across individual variable capacitors. The resistive network may employ resistors having values of 1 killiohm or more to ensure minimal RF loss across the stacked variable capacitors. This may result in a high resistor-capacitor (RC) time constant for the feed network that limits the rate at which the capacitance of the variable capacitors may be modulated. A modulation response time of such an arrangement could be on the order of 20-50 microseconds. However, in order to implement efficient amplification of waveforms having a signal bandwidth of 10-20 megahertz (MHz), a modulation response time of 10-20 nanoseconds may be desired.

Figure 4:
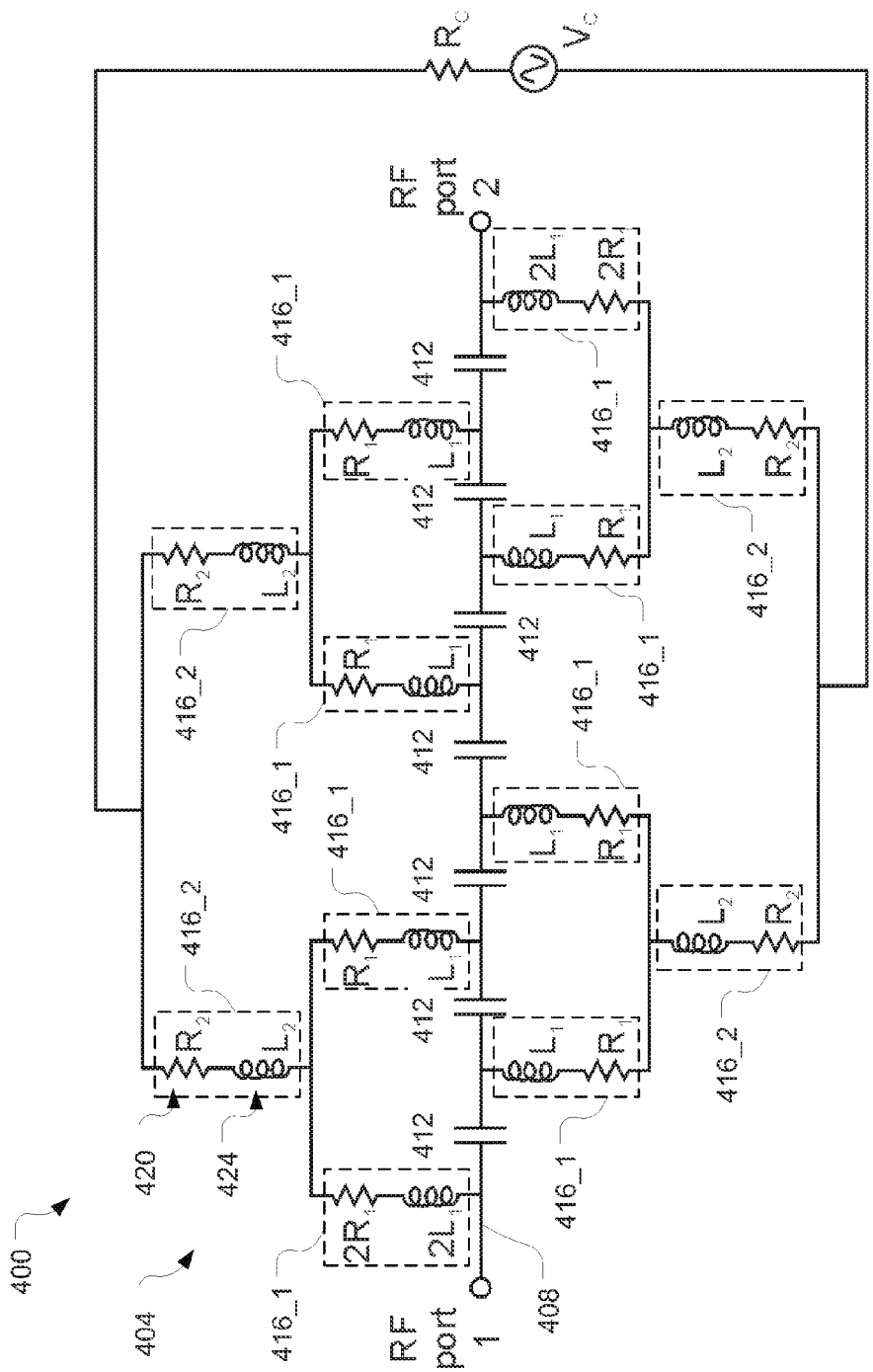
FIG. 4 illustrates a stacked-capacitor arrangement in accordance with some embodiments.

FIG. 4 illustrates a stacked capacitor arrangement 400 that may be used to reduce an RC time constant in accordance with some embodiments. The stacked capacitor arrangement 400 (or simply "arrangement 400") may include a feed network 404 that may be coupled with a capacitor line 408 having a plurality of variable capacitors 412, which may be varactor or BST capacitors, coupled in series with one another. The feed network 404 may be configured to receive a modulation control signal, Vc, e.g., from modulation controller 116. The feed network 404 may include a number of frequency-varying resistive elements 416 that are designed to increase modulation response time of feed network 404. This may allow for the rapid modulation of the loadline, e.g., on the order of nanoseconds.

The resistive elements 416 may each include a resistor 420 and an inductor 424. The resistive elements 416 may include first-level resistive elements 416_1, e.g., those coupled directly with the capacitor line 408, and second-level resistive elements 416_2, e.g., those coupled between the first-level resistive elements 416_1 and a modulation controller. In other embodiments, e.g., embodiments having different number of stacked capacitors, the feed network 404 may include resistive elements of other levels.

Some of the first-level resistive elements 416_1 may have resistors with a resistance R_1 and inductors with an inductance L_1. The first-level resistive elements 416_1 coupled with the capacitor line 408 closest to RF port 1 and RF port 2 may have components that are twice the size of the other first-level components, i.e., resistors with a resistance 2R_1 and inductors with an inductance 2L_1. The second-level resistive elements 416_2 may have resistors with a resistance of R_2 and inductors with an inductance L_2.

The resistors 420 and inductors 416 may provide the resistive elements 416 with a frequency-dependent impedance that sets a relatively low impedance within the modulation bandwidth, e.g., ≤100 MHz, and a relatively high impedance within the signal bandwidth, ≥700 MHz. Further, the feed network 404 may provide a modulation response time in the desired range, e.g., 10-20 nanoseconds. In some embodiments, the individual impedances desired for the signal bandwidth may be on the order of a few kilo ohms (kΩ), which may correspond to relatively large inductors.

Figure 5:
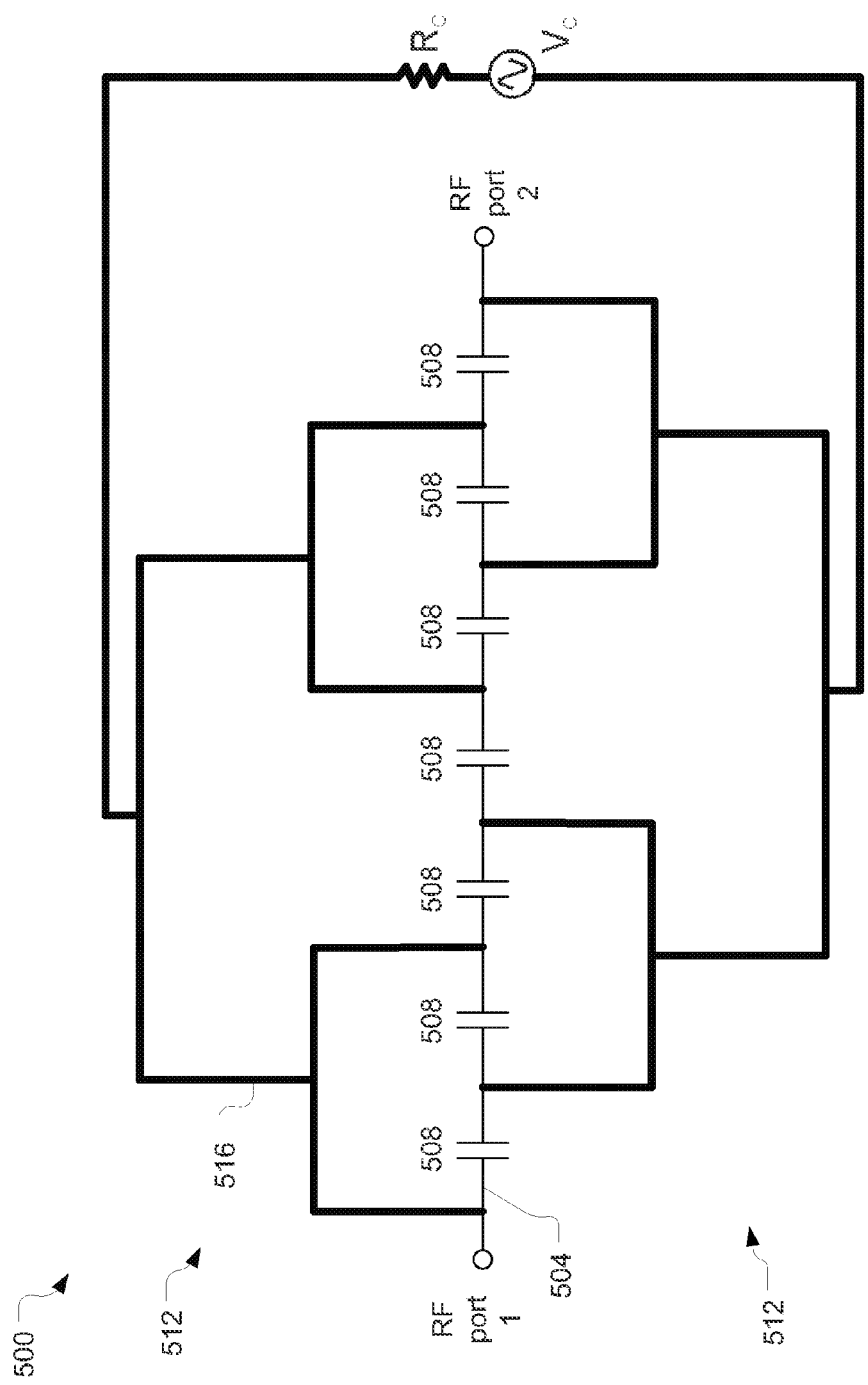
FIG. 5 illustrates another stacked-capacitor arrangement in accordance with some embodiments.

FIG. 5 illustrates a stacked capacitor arrangement 500 that may be used to reduce an RC time constant in accordance with other embodiments. In this embodiment, capacitor line 504 includes stacked variable capacitors 508, similar to that shown and described with respect to FIG. 4. However, arrangement 500 includes a feed network 512 with resistive elements composed of a plurality of resistive traces 516 fabricated from a material having relatively high magnetic permeability, e.g., approximately 100 or more. The materials may include, but are not limited to, iron (Fe), nickel (Ni), cobalt (Co), etc. Such materials may have a pronounced skin effect that restricts current flow to outer vicinities of the traces as frequency increases. Thus, the resistive traces 516 may have an effective resistance that increases with frequency.

Figure 6:
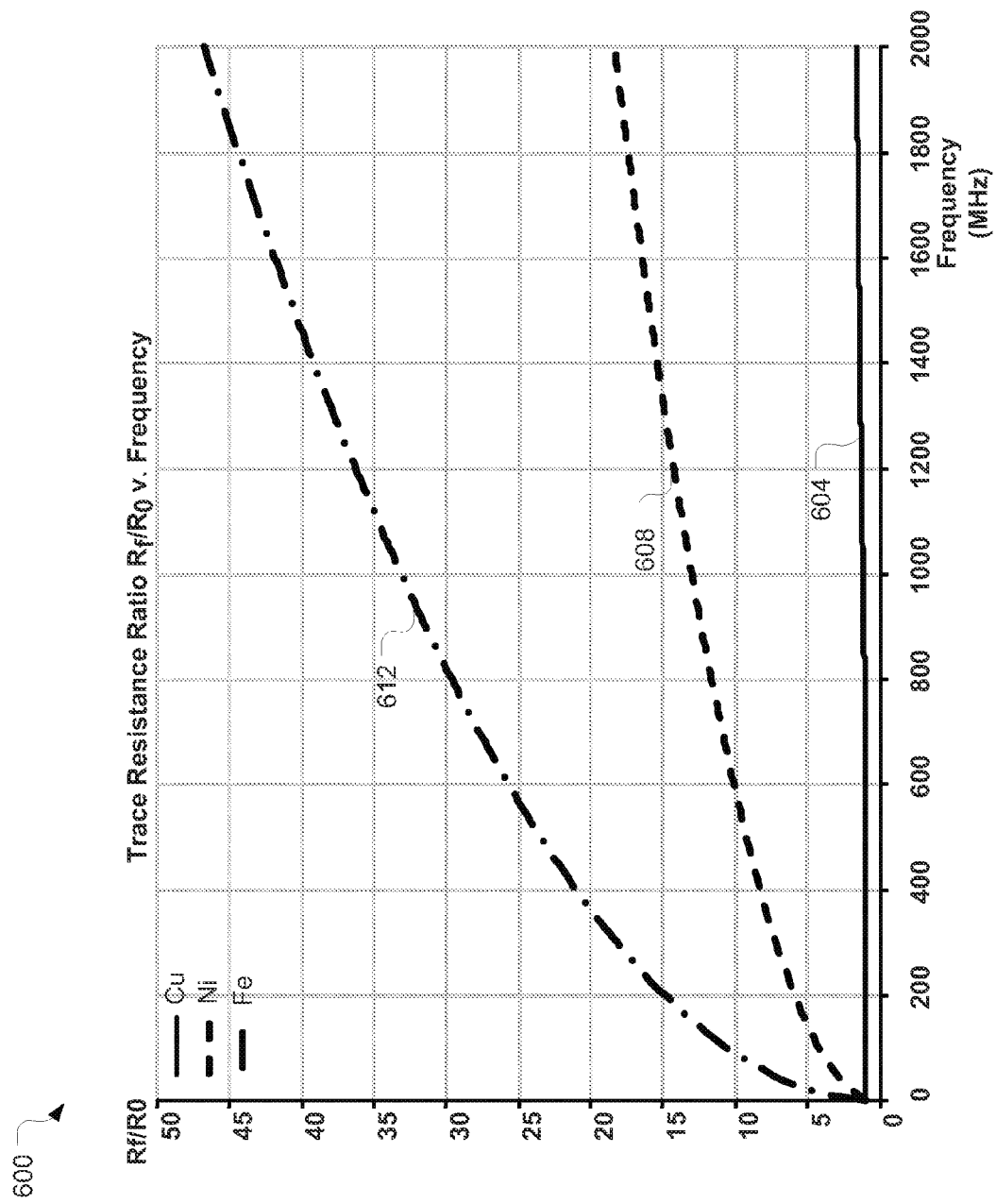
FIG. 6 is a chart demonstrating skin effect in accordance with some embodiments.

FIG. 6 is a chart 600 demonstrating the skin effect in accordance with some embodiments. Specifically, a trace resistance ratio, measured as a ratio of $R_f/R_0$, as a function of signal frequency is provided for copper (Cu) 604, nickel (Ni) 608, and iron (Fe) 612. $R_f$ is a resistance of a trace having 2 micron thickness at frequency f and $R_0$ is a resistance of the trace at DC, i.e., f=0. As can be seen, at increased frequency, for a given thickness conductor, traces constructed from a high permeability conductor will exhibit a larger increase in resistance than those made from a relatively low permeability material such as Cu.

In some embodiments, the resistive traces 516 may be formed in an inductive manner, e.g., forming one or more inductors, thereby enhancing the desired effect.

Utilizing resistive traces 516 in the feed network 512, as described, may result in an effective impedance at low frequency, e.g., less than approximately 20 MHz, being reduced by a factor of 10 or more from an effective impedance at a high frequency, e.g., greater than approximately 1,000 MHz. This may provide desired RF isolation as well as having a reduced RC time constant that results in a modulation response time of the capacitance of the variable capacitors 508 to be within the desired range, e.g., 10-20 nanoseconds.

In some embodiments, the resistive traces 516 may have a uniform cross-sectional geometry. In other embodiments, different resistive traces 516 may include different cross-sectional geometries.

Figure 7:
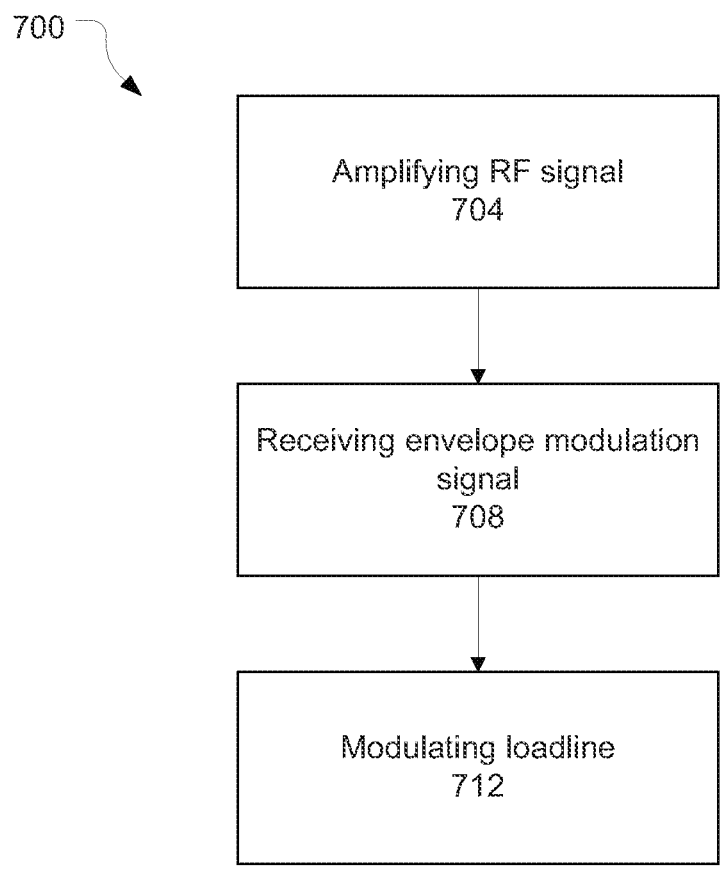
FIG. 7 is a flowchart illustrating an amplification operation in accordance with some embodiments.

FIG. 7 is a flowchart illustrating an amplification operation 700 of, e.g., the RF amplification circuit 100, in accordance with some embodiments. The amplification operation 700 may include, at block 704, amplifying an RF signal. Amplifying the RF signal may be done through one or more stages of an RF power amplifier, e.g., power amplifier 104.

The amplification operation 700 may further include, at block 708, receiving an envelope modulation signal. The receiving of the envelope modulation signal may be done by the modulation controller 116. In some embodiments, the envelope modulation signal may be received from transceiver circuitry and may indicate real-time changes in a waveform envelope of a particular transmission modulation scheme, e.g., LTE.

The amplification operation 700 may further include, at block 712, modulating a loadline. The modulating of the loadline may be based on the received envelope modulation signal. The modulating of the loadline may be done by a modulation controller, e.g., modulation controller 116, providing a control signal to vary effective capacitance of a switched element bank, e.g., 300, 330, or 362, or to vary capacitance of individual variable capacitors of a stacked capacitor arrangement, e.g., 400 or 500. In some embodiments, the control signals may be provided to the capacitors through a feed network, e.g., feed network 404 or 516.

Figure 8:
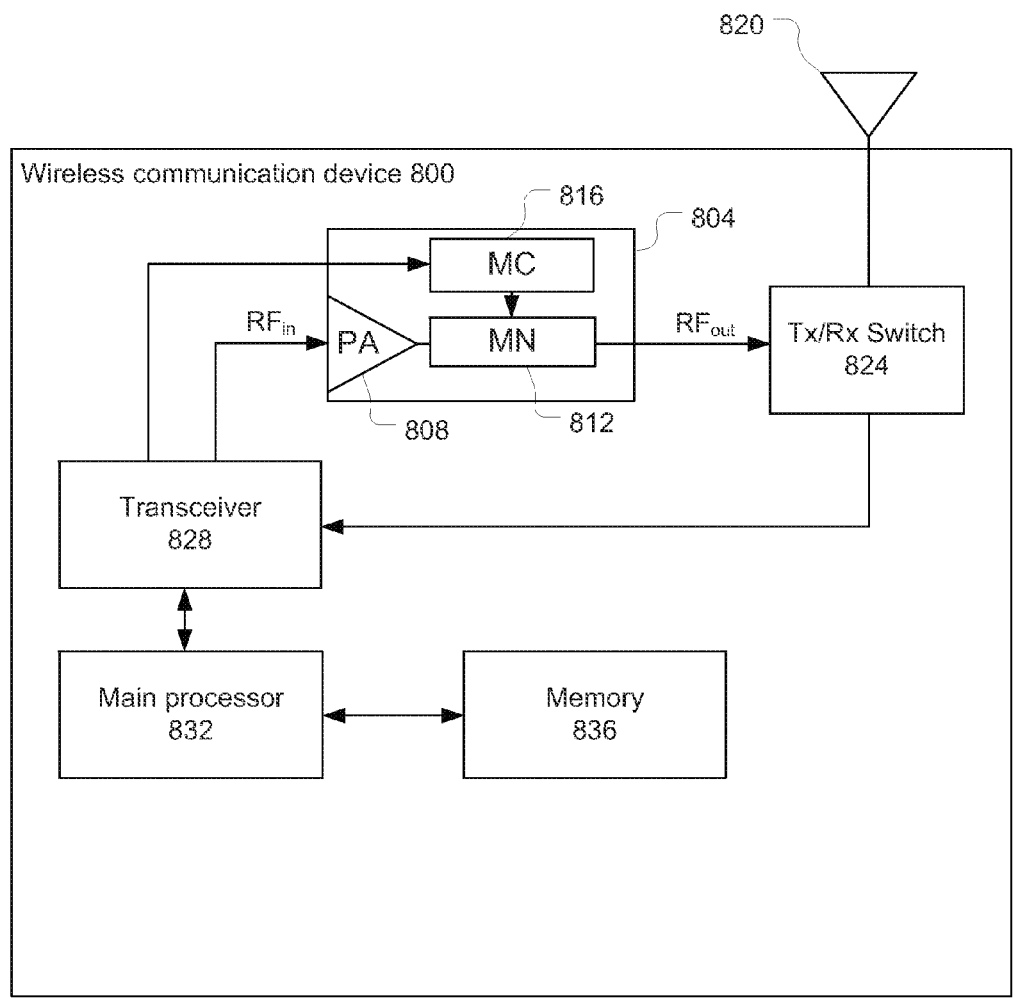
FIG. 8 illustrates a mobile device having an RF amplification circuit in accordance with various embodiments of the present invention.

A block diagram of an exemplary wireless communication device 800 is illustrated in FIG. 8 in accordance with some embodiments. Wireless communication device 800 may have RF amplification circuit 804 including a power amplifier (PA) 808, matching network (MN) 812, and modulation controller (MC) 816. The RF amplification circuit 804 may be similar to, and substantially interchangeable with, RF amplification circuit 100.

In addition to the RF amplification circuit 804, the wireless communication device 800 may have an antenna structure 820, a Tx/Rx switch 824, a transceiver 828, a main processor 832, and a memory 836 coupled with each other at least as shown. While the wireless communication device 800 is shown with transmitting and receiving capabilities, other embodiments may include devices with only transmitting or only receiving capabilities.

In various embodiments, the wireless communication device 800 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 832 may execute a basic operating system program, stored in the memory 836, in order to control the overall operation of the wireless communication device 800. For example, the main processor 832 may control the reception of signals and the transmission of signals by transceiver 828. The main processor 832 may be capable of executing other processes and programs resident in the memory 836 and may move data into or out of memory 836, as desired by an executing process.

The transceiver 828 may receive outgoing data (e.g., voice data, web data, e-mail, signaling data, etc.) from the main processor 832, may generate the RFin signal(s) to represent the outgoing data, and provide the RFin signal(s) to the power amplifier 808. The transceiver 828 may also provide an envelope tracking signal to the modulation controller 816. The modulation controller 816 may generate modulation control signals that are provided to the matching network 812 based on the envelope tracking signal.

The RF amplification circuit 804 may amplify the RFin signal, received from the transceiver 828, to provide RFout signal. The RFout signal may be provided to the Tx/Rx switch 824 and then to the antenna structure 820 for an over-the-air (OTA) transmission. In some embodiments, Tx/Rx switch 824 may include a duplexer.

In a similar manner, the transceiver 828 may receive an incoming OTA signal from the antenna structure 820 through the Tx/Rx switch 824. The transceiver 828 may process and send the incoming signal to the main processor 832 for further processing.

In various embodiments, the antenna structure 820 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 800 is given by way of example and that, for simplicity and clarity, only so much of the construction and operation of the wireless communication device 800 as is necessary for an understanding of the embodiments is shown and described. Various embodiments contemplate any suitable component or combination of components performing any suitable tasks in association with wireless communication device 800, according to particular needs. Moreover, it is understood that the wireless communication device 800 should not be construed to limit the types of devices in which embodiments may be implemented.

Although the present invention has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This description is intended to be regarded as illustrative instead of restrictive on embodiments of the present invention.

What is claimed is:

1. A circuit comprising:
a power amplifier to receive a radio frequency (RF) input signal and to transmit an RF output signal;
a matching network coupled with the power amplifier; and
a modulation controller coupled with the matching network and configured to modulate an impedance provided by the matching network to the power amplifier by dynamically modulating reactance values of elements of the matching network with a modulation bandwidth of approximately 5 megahertz or greater,
wherein the matching network includes a plurality of variable capacitors coupled with one another in series and the modulation controller is configured to modulate the impedance by dynamically modulating individual capacitive values of the plurality of variable capacitors, and the circuit further comprises:
a feed network including a plurality of resistive elements coupled in parallel with the plurality of variable capacitors and configured to provide frequency-dependent impedances.

2. The circuit of claim 1, wherein the one or more variable capacitors comprise one or more varactor diodes.

3. The circuit of claim 1, wherein the one or more variable capacitors comprise one or more capacitors with a voltage-dependent dielectric.

4. The circuit of claim 3, wherein the voltage-dependent dielectric comprises a borium strontium titanate (BST) dielectric.

5. The circuit of claim 1, wherein the plurality of resistive elements comprise a plurality of resistive traces fabricated from a material having relative magnetic permeability of approximately 100 or more.

6. The circuit of claim 5, wherein the material is nickel, iron, or cobalt.

7. The circuit of claim 5, wherein the plurality of resistive traces form one or more inductors.

8. The circuit of claim 5, wherein the plurality of resistive traces are configured to provide a first impedance that corresponds to the modulation bandwidth associated, and a second impedance that corresponds to a signal bandwidth associated with the RF output signal,
wherein the second impedance is greater than the first impedance.

9. The circuit of claim 8, wherein the modulation bandwidth is less than approximately 100 megahertz, and the signal bandwidth is greater than approximately 700 megahertz.

10. The circuit of claim 1, wherein the matching network has a modulation response time between approximately 10 and 20 nanoseconds.

11. The circuit of claim 1, wherein the modulation controller is configured to provide an analog control signal to modulate the impedance.

12. The circuit of claim 1, wherein the modulation controller is configured to provide a digital control signal to modulate the impedance.

13. A circuit comprising:
a power amplifier to receive a radio frequency (RF) input signal and to transmit an RF output signal;
a matching network coupled with the power amplifier; and
a modulation controller coupled with the matching network and configured to modulate an impedance provided by the matching network to the power amplifier by dynamically modulating reactance values of elements of the matching network with a modulation bandwidth of approximately 5 megahertz or greater,
wherein the matching network includes a switched-element block having one or more switches configured to dynamically switch one or more elements into or out of the matching network based on a control signal provided by the modulation controller.

14. A circuit comprising:
a power amplifier to receive a radio frequency (RF) input signal and to transmit an RF output signal;
a matching network coupled with the power amplifier and having a plurality of variable capacitors coupled in series with one another on a capacitor line;
a feed network having a plurality of resistive elements coupled with the capacitor line, the plurality of resistive elements configured to provide frequency-dependent impedances; and
a modulation controller coupled with the plurality of variable capacitors through the feed network and configured to modulate an impedance provided by the matching network to the power amplifier by dynamically modulating capacitance values of the plurality of variable capacitors.

15. The circuit of claim 14, wherein the plurality of variable capacitors comprise a plurality of varactor diodes.

16. The circuit of claim 14, wherein the plurality of variable capacitors comprise a plurality of capacitors with a voltage-dependent dielectric.

17. The circuit of claim 16, wherein the voltage-dependent dielectric comprises a borium strontium titanate (BST) dielectric.

18. The circuit of claim 14, wherein the one or more variable capacitors include a plurality of variable capacitors coupled with one another in series and the circuit further comprises:
a feed network comprising a plurality of resistive elements coupled in parallel with the plurality of capacitive elements and configured to provide frequency-dependent impedances.

19. The circuit of claim 14, wherein the plurality of resistive elements comprise a plurality of resistive traces fabricated from a material having relative magnetic permeability of approximately 100 or more.

20. The circuit of claim 19, wherein the material is nickel, iron, or cobalt.

21. The circuit of claim 19, wherein the plurality of resistive traces form one or more inductors.

22. The circuit of claim 14, wherein the plurality of resistive traces are configured to provide a first impedance that corresponds to a modulation bandwidth associated with a control signal of the modulation controller, and a second impedance that corresponds to a signal bandwidth associated with the RF output signal, wherein the second impedance is greater than the first impedance.

23. The circuit of claim 22, wherein the modulation bandwidth is less than approximately 100 megahertz, and the signal bandwidth is greater than approximately 700 megahertz.

24. A method comprising:
amplifying, with a power amplifier, a radio frequency signal;
receiving an envelope modulation signal; and
modulating, with a modulation bandwidth of approximately 5 megahertz or greater, reactance values of elements of a matching network coupled with the power amplifier based on the envelope modulation signal,
wherein modulating reactance values includes controlling one or more semiconductor switches of the matching network.

25. The method of claim 24, further comprising:
providing a control signal to the elements through a feed network that includes resistive elements providing frequency-dependent impedances.

26. The method of claim 25, wherein the resistive elements are fabricated from a material having relative magnetic permeability of approximately 100 or more.

27. A system comprising:
one or more antennas;
a transceiver; and
a power amplification circuit coupled with the one or more antennas and the transceiver, the power amplification circuit having a power amplifier configured to receive an input radio frequency signal provide an output radio frequency signal as an amplified version of the input radio frequency signal;
a matching network coupled with the power amplifier and configured to transform an impedance at the power amplifier to an output impedance; and
a modulation controller configured to vary reactances of elements of the matching network with a modulation bandwidth of approximately 5 megahertz or greater based on envelope changes of the input radio frequency signal,
wherein the power amplification circuit includes:
a feed network having a plurality of resistive elements coupled in parallel with a plurality of variable capacitors of the matching network and configured to provide frequency-dependent impedances.

28. The system of claim 27, wherein the plurality of resistive elements comprise a plurality of resistive traces fabricated from a material having relative magnetic permeability of approximately 100 or more.

29. The system of claim 27, wherein the matching network includes one or more semiconductor switches, and the modulation controller is to vary reactances of elements by controlling the one or more semiconductor switches.

30. The circuit of claim 13, wherein the matching network includes one or more semiconductor switches, and the modulation controller is to modulate the impedance by controlling the one or more semiconductor switches.

* * * * *